Oct. 15, 1963 B. A. VIZZIER, SR 3,107,319

MODULAR COMPONENT PRINTED CIRCUIT CONNECTOR

Filed May 28, 1962

INVENTOR.
BENTON A. VIZZIER, SR.
BY
Mead, Browne, Schuyler & Beveridge
ATTORNEYS

United States Patent Office 3,107,319
Patented Oct. 15, 1963

3,107,319
MODULAR COMPONENT PRINTED CIRCUIT CONNECTOR

Benton A. Vizzier, Sr., Huntsville, Ala., assignor to The Brown Engineering Company, Inc., Huntsville, Ala., a corporation of Alabama Filed May 28, 1962, Ser. No. 198,335
7 Claims. (Cl. 317—101)

This invention relates to printed circuit connectors and more particularly to a modular assembly of electrical components on a circuit board connector for the simultaneous making of the various connections necessary to complete a circuit module.

Various types of circuit connectors have been proposed for the interconnection of semi-rigid printed circuit boards. These have generally been complicated to manufacture or of poor reliability, and have generally not been adaptable to the various purposes at hand. Previous circuit board connectors have generally not provided means for end-to-end connection of circuit boards. A modular assembly of the type here disclosed has not previously been available as an attachable unit to cooperate with a circuit board to form a circuit module.

It is an object of the present invention to provide a simplified end-to-end connector for circuit boards with provision for a wide variety of cross connections between circuit boards.

Another object of the invention is to provide a circuit board connector for one or more circuit boards with solder lug connections to external circuit components by way of wire leads.

A further object of this invention is to provide a simple module or functional element of a circuit in which electrical components are mounted on the connector and connected to the printed circuit board by a simple clamping operation.

A still further object of the invention is to provide an end-to-end connection for two circuit boards in which one or more functional elements are incorporated on the connector between the circuits of the two circuit boards.

A still further object of the invention is to provide a simplified construction for a set of contacts at each end of a circuit connector to be combined with electrical circuit elements clamped thereagainst.

In order to achieve these purposes, applicants employ a simple insulator block of generally rectangular shape having at least one flat surface for engagement with the printed circuit board or boards having end slots for the insertion of circuit connector elements placed therein and retained by means of spring detent action to provide on the contact surface of the block a series of contacts at each end thereof, and on the opposite face a series of solder lugs to which other circuit elements are connected to form modules of many kinds.

A better understanding of the invention will be had by reference to the drawings in which.

A modular component base block 10 is shown attached to circuit boards 11 and 12 received in end-to-end fashion as by means of machine screws 13 and 14. It will be obvious that a variety of modular components or groups of components, may be assembled on a block 10 and connected to a single circuit board having connections in the form of surface conductors therealong extending from one end to the other end of the block 10. In such a case circuit elements mounted on the lugs of the assembly would be cross-connected in a fashion as to produce the desired connections between the several conductors on the face of one circuit board such as 11, then extending along the full length of block 10.

Figure 2:
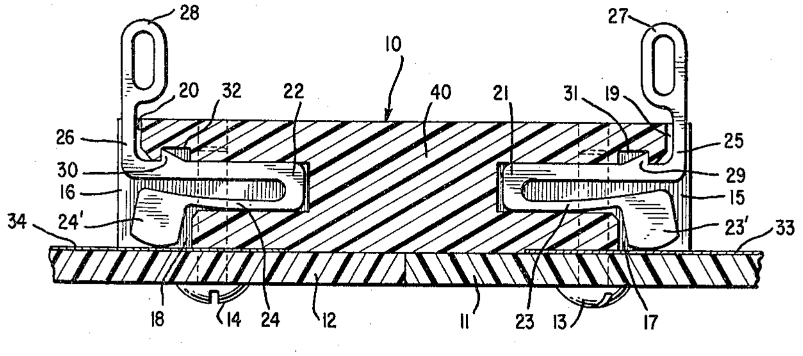
FIG. 2 is a vertical section along lines 2—2 of FIG. 1.

By reference to FIG. 2 it will be observed that two deepened pockets are formed, one at each end of the block 10 in each vertical section corresponding to a contact position, illustrated at 15 and 16. These pockets may generally extend each approximately one-third of the length of the block, and each be formed in a generally rectangular pattern which is transverse to the width and parallel to the linear extension of the block 10. Each pocket 15, 16 is broadened as at 17, 18 to provide space for a contact element to extend from pocket 15, 16 beyond the lower face of block 10 against which a printed circuit board will be pressed. A similar, but narrower, pocket extension 19, 20 is formed opposite 17 or 18 in the end of the block such that the pockets 15, 16 combined with the openings 17, 18 and the openings 19, 20 form a slot which is transverse to the end face of the block 10. In each pocket 15, 16 there is inserted a contact element 21, 22 having a generally U-shape, formed by stamping or similar operation from a sheet of beryllium copper or the like. This stamping is of a thickness and temper such as to provide a good spring contact element which fits snugly within the pocket 15, 16 when assembled. Each member 21, 22 has a portion 23, 24 which is one leg of the U-shaped member terminated at the outer end in an enlargement 23′, 24′ suitably formed so that when assembled in the pocket 15, 16 the portion 23′, 24′ extends beyond the lower surface of the block 10 when board 11, 12 is not pressed thereagainst. On the opposite end of each U-shaped contact element there is preferably formed shank 25, 26 which carries solder lug 27, 28 at the outer end thereof and is assembled in slot 19, 20 to extend above the upper surface of the connector block.

In order that the modular component connector be rugged and shock proof U-members 21, 22 inserted in pockets 15, 16 are provided with detents 29, 30 which engage recesses 31, 32 in the upper portion of the block 10. Recesses 31, 32 are preferably formed approximately in line with slotted openings 17, 18 in the contact face of the block, for the purpose of ease of manufacture, assembly and inspection.

Figure 1:
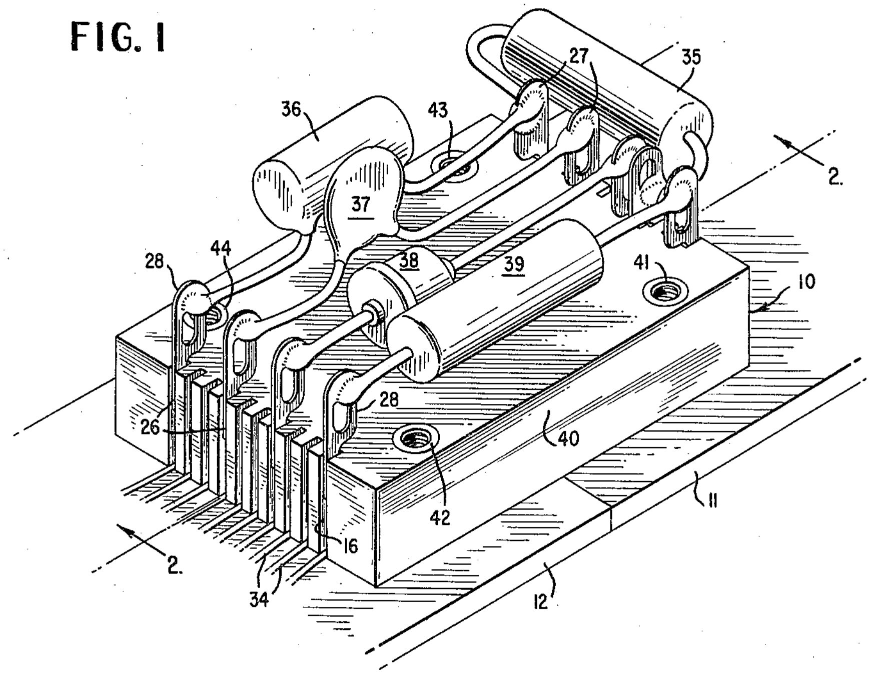
FIG. 1 is a perspective view of a modular component for use between two circuit boards.

When contact elements 21, 22 are inserted in recesses or pockets 15, 16, detents 29, 30 pass by the outer portions of the upper walls of pockets 15, 16 and detents 29, 30 are snapped into recesses 31, 32 as the inner end of the U-shaped elements 21, 22 seat at the bottom of pockets 15, 16. It is thus apparent that considerable strain could be placed on the solder lugs 27, 28 or upon spring elements 23, 24 without unseating detents 29, 30 from the recesses 31, 32. At the same time, an assembly is provided in which contact elements may be quickly inserted or may be left out of selected pockets as may be desired for the connections not desired. As illustrated in FIG. 1 only those pockets are filled with contact elements which are to be connected to an external circuit component.

Circuit boards 11 and 12 have on one side thereof, or on both sides, surface conductors 33, 34 which are either printed thereon or otherwise placed along the surface of rigid members 11, 12. Such circuit boards normally have from 10 to 40 conductors arranged therealong, which may be either in a pattern of interconnection or as straight through connectors sometimes employed in lieu of cabled wire connections from one circuit locale to another. As illustrated, the circuit connector boards are at least semi-rigid in nature in order that the spring pressure on the contact portions 23′, 24′ will not distort the circuit board to the point of inadequate contact pressure, though other means may be employed to maintain adequate contact pressure across the width of the block 10.

Illustrated in FIG. 1 is a resistor 35 interconnecting the solder lugs of two contact elements at one end of the block which it may be desired to so interconnect. Circuit components or elements 36, 37, 38 and 39 are shown interconnecting corresponding solder lugs at opposite ends of the block 10, thus connecting certain of the circuit board 33 connections to corresponding circuit board connections at the opposite end of block 10. Circuit element 36 might for example be a capacitor of high capacity whereas element 37 is of a lower value, and element 39 a resistor or other element as may be desired. Element 38 illustrates a diode or might equally well be a transistor, which would have two leads from one end, each extending to a different solder lug in accordance with the circuit function to be performed between the conductors thus interconnected through the transistor.

In FIG. 1 the two circuit boards 11 and 12 are supported by means of block 10 employing machine screws or the like in screw holes 41, 42, 43 and 44. It will be evident that a modular component assembled on a block 10 may be secured to a single circuit board by means of two screws at either end the block. Such an arrangement provides a complete circuit element which may be clamped to a circuit board for experimental assemblies and removed therefrom on short notice for reassembly without resoldering. This provides the versatility of circuitry for circuit board modular construction without replacing the circuit boards. It may be worked out in simple techniques at very low cost and with a very high degree of reliability in accordance with the many purposes to which such apparatus may be put.

While the invention has been described in a specific embodiment showing a preferred form of construction it will be understood that the invention may be otherwise practiced within the scope of the appended claims.

What is claimed is:

1. A modular assembly of electrical components for pressure connection through a printed circuit board, comprising:

a body of insulating material having a lower face shaped to receive said board therealong, a plurality of vertical contact slots in each end of said body, a channel for each said slot recessed into the end of the body, an extension of each said slot across said channel and to said lower face, a U-shaped contact element arranged within each of a plurality of said channels, having at said lower face a contact projection normally protruding beyond said extension as it intersects said lower face to form a circuit board contact, a connector lug formed as a part of each said element and extending vertically through a said slot, and a plurality of electrical circuit components connected each between two said lugs selected according to interconnections to be selectively provided by said board when contacting said face, said components being selected and arranged to provide a functional electrical combination in module form when interconnected by the circuitry on said board.

2. The modular assembly of claim 1 including means securing a circuit board in fixed position on said lower face to complete said interconnection.

3. The modular assembly of claim 1 including means arranged to secure said contact elements at one end of said body in fixed position on one said circuit board and said contact elements at the other end of said body in fixed position on another said circuit board, thereby to responsively connect selected circuits of one said board to the other.

4. The modular assembly of claim 1 wherein each said channel has a relieved portion in one wall thereof and each said contact element has a detent portion engagedly snap-fitted therein to retain said element in said slot.

5. A circuit connector for components to be assembled in contact with a printed circuit board, comprising a block of insulating material having generally plane upper and lower surfaces of which the lower surface is fitted to receive thereagainst printed circuit contact portions, a plurality of slots separated by body wall portions and extending from one said surface to the other formed in the opposite ends of said block, a rectangular recess in each said slot extending inwardly toward the center of the block, a U-shaped contact member formed with a contact portion projecting exteriorly of the side of said recess at said lower face and with a connector lug extending upwardly beyond said upper face when the member is within said recess, said member being of resilient conducting material, means including a cavity in one edge of said recess and a detent formed on an outer portion of one leg of said contact member snap-fitted into said cavity for retaining said member in said recess, and means securing at least one circuit board to said lower surface in fixed position to cause contact by said members individually upon said board at predictable positions thereon to provide positioned connections therefrom to said lugs, respectively.

6. A printed circuit board connector, comprising a block of insulating material formed with a planar lower surface for contact with a circuit board surface and an upper surface for the mounting of connecting elements, a plurality of slots extending from one said surface to the other in each end of said block, each slot having a rectangular pocket recessed from the inner portion of the slot toward the center of the block and having a recess on the outer portion thereof at one side, a U-shaped contact element in each said pocket having a detent engaging said recess to retain the element in the pocket, a solder lug formed at the end of each said element in the portion of each slot beyond said pocket and extending laterally through said slot to the exterior of the block opposite said planar surface, and a contact projection on the exterior of each said element opposite said lug and extending through said slot beyond said planar surface to contact a conductor placed against said circuit board surface thereat.

7. In a connector for two printed circuit boards a block of insulating material having a contact face along one side and a face to receive solder lug connections at the opposite side, a plurality of pockets formed in each end of said block shaped to receive a U-shaped contact member and having the length thereof parallel to said face and the width perpendicular thereto, a U-shaped spring contact member in each said pocket having a contact portion extending exteriorly of said block and laterally beyond said face, a detent on each said member opposite said portion, a lateral recess in the pocket engaging said detent to retain the member therein regardless of movement of the contact portion, a lug connector opposite said contact portion extending beyond said opposite face for wire connecting external circuitry to said connector, and securing means at each end of the block for holding the end of a rigid contact board in fixed position against the contact portions of the contact members extending through said contact face.

References Cited in the file of this patent

UNITED STATES PATENTS

| | | |
|---|---|---|
| 2,470,618 | Holden | May 17, 1949 |
| 2,832,942 | French | Apr. 29, 1958 |
| 2,942,229 | Berger | June 21, 1960 |
| 2,944,121 | Wasylenko | July 5, 1960 |

OTHER REFERENCES

Rice et al.: IBM Technical Disclosure Bull., February 1962, page 7.

Becon: Electronic Design, March 15, 1962, page 65.